United States Patent
Vaartstra

(10) Patent No.: US 6,828,256 B2
(45) Date of Patent: *Dec. 7, 2004

(54) METHODS FOR FORMING METAL-CONTAINING FILMS USING METAL COMPLEXES WITH CHELATING O- AND/OR N-DONOR LIGANDS

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/756,232

(22) Filed: Jan. 13, 2004

(65) Prior Publication Data

US 2004/0147138 A1 Jul. 29, 2004

Related U.S. Application Data

(60) Continuation of application No. 10/223,425, filed on Aug. 19, 2002, now Pat. No. 6,682,602, which is a division of application No. 09/649,556, filed on Aug. 28, 2000, now Pat. No. 6,455,717, which is a division of application No. 09/144,745, filed on Sep. 1, 1998, now Pat. No. 6,225,237.

(51) Int. Cl.[7] .............................................. H01L 21/31
(52) U.S. Cl. ...................... 438/778; 438/785; 438/793; 438/794
(58) Field of Search ................ 438/778, 765, 438/793, 794, 785

(56) References Cited

U.S. PATENT DOCUMENTS

| | | | |
|---|---|---|---|
| 5,607,722 A | 3/1997 | Vaartstra et al. | |
| 5,659,057 A | 8/1997 | Vaartstra | |
| 5,695,815 A | 12/1997 | Vaartstra | |
| 5,763,633 A | 6/1998 | Vaartstra | |
| 5,874,131 A | 2/1999 | Vaartstra et al. | |
| 6,010,969 A | 1/2000 | Vaartstra | |
| 6,020,511 A | 2/2000 | Vaartstra et al. | |
| 6,095,161 A | 8/2000 | Vaartstra | |
| 6,217,645 B1 | 4/2001 | Vaarstra | |
| 6,225,237 B1 * | 5/2001 | Vaartstra | 438/778 |
| 6,244,575 B1 | 6/2001 | Vaartstra et al. | |
| 6,368,398 B2 | 4/2002 | Vaartstra | |
| 6,402,126 B2 | 6/2002 | Vaartstra et al. | |
| 6,455,717 B1 | 9/2002 | Vaartstra | |
| 6,682,602 B2 | 1/2004 | Vaartstra | |

FOREIGN PATENT DOCUMENTS

WO    WO 98/36035    8/1998

OTHER PUBLICATIONS

Aris, et al., "Metallacycles of the imidoylamidinato compounds HNC(R)NC(R)NH and group 14 elements. Crystal structure of the complex [GaMe$_2$ {HNC(CF$_3$)NC(CF$_3$)NH}]," *J. Chem. Soc.*, Dalton Trans., 1997; 909–910.

(List continued on next page.)

*Primary Examiner*—Alexander Ghyka
(74) *Attorney, Agent, or Firm*—Mueting, Raasch & Gebhardt, P.A.

(57) ABSTRACT

A method of forming a film on a substrate using one or more complexes containing one or more chelating O- and/or N-donor ligands. The complexes and methods are particularly suitable for the preparation of semiconductor structures using chemical vapor deposition techniques and systems.

20 Claims, 4 Drawing Sheets

OTHER PUBLICATIONS

Dorokhov et al., *Doklady Chemistry: Proceedings of the Academy of Sciences of the USSR*, 1970, Dec.; 195(4–6):904–7.

Dorokhov et al., "abstract No. 5998," *Chemical Abstracts*, 1971; 75(1):502.

Raban et al., "Alkali Metal Chelation by Diacetamide," *Tetrahedron Letters* 1979; 19:1633–1636.

Rochon et al., "Hydrolysis and Dimerization of Nitrile to Diacetamide and Crystal Structures of Chloro (2,2,2,2',2',2'-hexachlorodiacetamido) (dimethyl sulfoxide) platinum (II) and *cis*–Aquadichloro (dimethyl sulfoxide) platinum (II)," *Inorg. Chem.*, 1990; 29:2708–2712.

Sax and Lewis, Sr., "boroethane," *Hawley's Condensed Chemical Dictionary, Eleventh Edition*, New York, New York, 1987; 163.

Versteeg et al., "Metalorganic Chemical Vapor Deposition By Pulsed Liquid Injection Using An Ultrasonic Nozzle: Titanium Dioxide on Sapphire from Titanium (IV) Isopropoxide," *Journal of American the Ceramic Society*, 1995; 78:2763–2768.

* cited by examiner

METHODS FOR FORMING METAL-CONTAINING FILMS USING METAL COMPLEXES WITH CHELATING O- AND/OR N-DONOR LIGANDS

This is a continuation of application Ser. No. 10/223,425, filed Aug. 19, 2002, now U.S. Pat. No. 6,682,602 which is a divisional of application Ser. No. 09/649,556, filed Aug. 28, 2000 (now U.S. Pat. No. 6,455,717), which is a divisional of application Ser. No. 09/144,745, filed Sep. 1, 1998 (now U.S. Pat. No. 6,225,237), which are all incorporated herein by reference in their entireties.

FIELD OF THE INVENTION

This invention relates to methods and complexes for forming metal-containing films, such as metal or metal alloy films, particularly during the manufacture of semiconductor device structures. The complexes preferably include a low valent metal, and are particularly suitable for use in a chemical vapor deposition system.

BACKGROUND OF THE INVENTION

High quality thin oxide films of metals, such as barium-strontium-titanates and strontium-bismuth-tantalates deposited on semiconductor wafers have recently gained interest for use in memories (e.g., dynamic random access memory (DRAM) devices, static random access memory (SRAM) devices, and ferroelectric memory (FE RAM) devices). These materials have very high dielectric constants and excellent resistance to fatigue. They also have suitable properties for a variety of other uses, such as electrooptic materials, pyroelectric materials, and antireflective coatings.

Suitable metal oxides are typically delivered to a substrate in the vapor phase; however, many oxides are difficult to deliver using vapor deposition technology. Many precursors are sensitive to thermal decomposition. Also, many precursors have vapor pressures that are too low for effective vapor deposition. For example, molecules containing certain low-valent metals, such as barium, tend to aggregate, which causes poor volatility. Thus, there is a continuing need for methods and materials for the deposition of oxide films using vapor deposition processes on semiconductor structures, particularly random access memory devices.

SUMMARY OF THE INVENTION

The present invention provides complexes and methods for forming metal-containing films, particularly low-valent metal-containing films, on substrates, such as semiconductor substrates or substrate assemblies during the manufacture of semiconductor structures. The methods involve forming a metal-containing film using a complex containing one or more chelating oxygen- and/or nitrogen-donor ligands. The metal-containing film can be used in various metallization layers, particularly in multilevel interconnects or dielectric layers, in integrated circuit structures.

The metal-containing film can be a film of a single metal, or it can be a metal alloy containing a mixture of metals, or a metal or mixture of metals with one or more metalloids. Furthermore, for certain preferred embodiments, the metal-containing film can be an oxide, nitride, sulfide, phosphide, arsenide, stibnide, selenide, silicilide, or combinations thereof.

Thus, in the context of the present invention, the term "metal-containing film" includes, for example, relatively pure films of main group metals, transition metals, or lanthanides, alloys of these metals, as well as complexes of metals or metal alloys with other elements (e.g., O, N, S, Si, P, As, Sb, and Se), or mixtures thereof. The term "single metal film" refers to relatively pure films of single metals. The term "metal alloy film" refers to films of these metals in alloys with or without other metals or metalloids, for example.

One preferred method of the present invention involves forming a film on a substrate, such as a semiconductor substrate or substrate assembly during the manufacture of a semiconductor structure, by: providing a substrate (preferably, a semiconductor substrate or substrate assembly); providing a precursor composition comprising one or more complexes of the formula:

(Formula I)

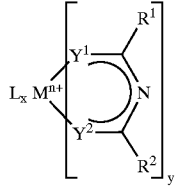

wherein: M is any metal (main group, transition metal, lanthanide); each Y group is independently O or N—$R^3$; L is a neutral or or anionic (e.g., monoanionic or dianionic) supporting ligand; each R group is independently H, or an organic group; x=0 to 6 (preferably, 0 to 2); n+ is the oxidation state of the metal, which is typically 0 to +6; y=n if L is neutral, y=n−x if L is monoanionic, or y=n−2x if L is dianionic; and forming a metal-containing film from the precursor composition on a surface of the substrate (preferably, a semiconductor substrate or substrate assembly). The metal-containing film can be a single metal film or an alloy film or an oxide, nitride, chalconide, etc. Using such methods, the complexes of Formula I are converted in some manner (e.g., decomposed thermally) and deposited on a surface to form a metal-containing film. Thus, the film is not simply a film of the complex of Formula I.

Complexes of Formula I are neutral complexes and may be liquids or solids at room temperature. If they are solids, they are preferably sufficiently soluble in an organic solvent or have melting points below their decomposition temperatures such that they can be used in flash vaporization, bubbling, microdroplet formation techniques, etc. However, they may also be sufficiently volatile that they can be vaporized or sublimed from the solid state using known chemical vapor deposition techniques. Thus, the precursor compositions of the resent invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material, preferably, however, there is a sufficient amount of the material that can be carried by the organic solvent into the vapor phase for chemical vapor deposition processing.

Yet another method of forming a metal-containing film on a substrate, such as a semiconductor substrate or substrate assembly during the manufacture of a semiconductor structure, involves: providing a substrate (preferably, a semiconductor substrate or substrate assembly); providing a precursor composition comprising one or more organic solvents and one or more complexes of Formula I as defined above; vaporizing the precursor composition to form vaporized precursor composition; and directing the vaporized precursor composition toward the substrate to form a metal-containing film on a surface of the substrate. Herein, vaporized precursor composition includes vaporized molecules of precursor complexes of Formula I either alone or optionally with vaporized molecules of other compounds in the precursor composition, including solvent molecules, if used.

Thus, preferred embodiments of the methods of the present invention involve the use of one or more chemical vapor deposition techniques, although this is not necessarily required. That is, for certain embodiments, sputtering, spin-on coating, etc., can be used.

Methods of the present invention are particularly well suited for forming films on a surface of a semiconductor substrate or substrate assembly, such as a silicon wafer, with or without layers or structures formed thereon, used in forming integrated circuits. It is to be understood that methods of the present invention are not limited to deposition on silicon wafers; rather, other types of wafers (e.g., gallium arsenide wafer, etc.) can be used as well. Also, methods of the present invention can be used in silicon-on-insulator technology. Furthermore, substrates other than semiconductor substrates or substrate assemblies can be used in methods of the present invention. These include, for example, fibers, wires, etc. If the substrate is a semiconductor substrate or substrate assembly, the films can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

A chemical vapor deposition system is also provided. The system includes a deposition chamber having a substrate positioned therein; a vessel containing a precursor composition comprising one or more complexes of Formula I as described above; and a source of an inert carrier gas for transferring the precursor composition to the chemical vapor deposition chamber.

The present invention also provides certain complexes of Formula I. For complexes of Formula I wherein both Y groups are oxygen or $NR^3$ groups, M is a main group metal selected from the group of Groups IA, IIA, IVA, and VA (i.e., Groups 1, 2, 14, and 15) metals or a transition metal selected from the group of Groups IB through VIIB (i.e., Groups 11, 12, and 3–7) metals. For complexes of Formula I wherein one Y group is oxygen and the other is an $NR^3$ group, M is a main group metal, transition metal, or a lanthanide.

The present invention further provides precursor compositions containing one or more organic solvents and one or more, complexes preferably, two or more, of Formula I wherein M is selected from the groups of Ba, Sr, and Ti, or Bi, Sr, and Ta, or Bi, Sr, and Nb, and the compositions include at least two complexes containing different metals.

DETAILED DESCRIPTION OF PREFERRED EMBODIMENTS

Figure 1:
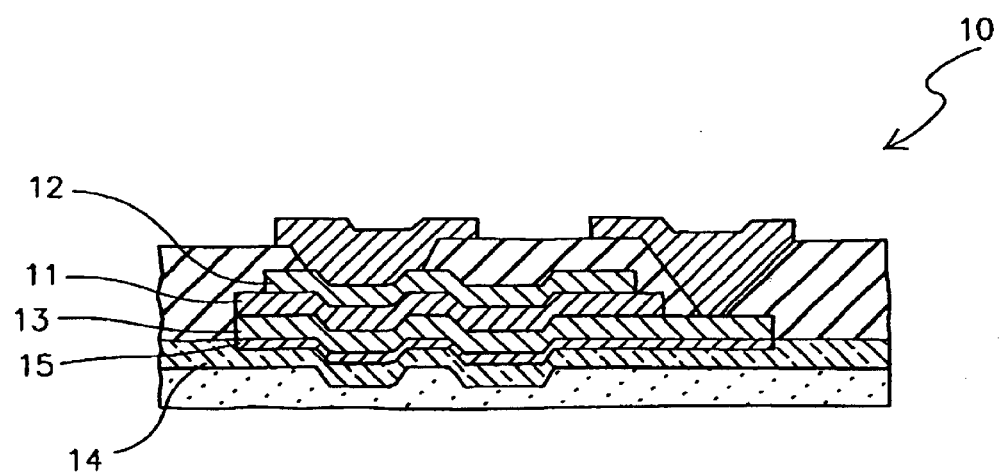
FIG. 1 is a cross-sectional schematic of a thin layer ferroelectric memory device having a ferroelectric oxide layer between the electrodes.

The present invention provides a method of forming a metal-containing film using one or more complexes containing one or more chelating O- and/or N-donor ligands. These complexes are mononuclear (i.e., monomers in that they contain one metal per molecule).

The complexes of Formula I are neutral complexes and may be liquids or solids at room temperature. Typically, they are solids. If they are solids, they are sufficiently soluble in an organic solvent to allow for vaporization, they can be vaporized or sublimed from the solid state, or they have melting temperatures below their decomposition temperatures. Thus, many of the complexes described herein are suitable for use in chemical vapor deposition (CVD) techniques, such as flash vaporization techniques, bubbler techniques, and/or microdroplet techniques. Preferred embodiments of the complexes described herein are particularly suitable for low temperature CVD, e.g., deposition techniques involving substrate temperatures of about 50° C. to about 200° C.

The solvents that are suitable for this application can be one or more of the following: aliphatic suturated or unsaturate linear, branched, or cyclic (alicyclic) hydrocarbons ($C_3$–$C_{20}$, and preferably $C_5$–$C_{10}$), aromatic hydrocarbons ($C_5$–$C_{20}$, and preferably $C_5$–$C_{10}$), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitriles, cyanates, isocyanates, thiocyanates, silicone oils, aldehydes, ketones, diketones, carboxylic acids, water, alcohols, thiols, or compounds containing combinations of any of the above or mixtures of one or more of the above. It should be noted that some precursor complexes are sensitive to reactions with protic solvents, and examples of these noted above may not be ideal, depending on the nature of the precursor complex. The complexes are also generally compatible with each other, so that mixtures of variable quantities of the complexes will not interact to significantly change their physical properties.

One preferred method of the present invention involves vaporizing a precursor composition that includes one or more metal complexes containing one or more chelating O- and/or N-donor ligands. The metal can be a main group metal, a transition group metal, or a lanthanide. Also, the precursor composition can include complexes containing metalloids or metals with other ligands.

The precursor composition can be vaporized in the presence of an inert carrier gas to form a relatively pure metal or metal alloy film. The inert carrier gas is typically selected from the group consisting of nitrogen, helium, argon, and mixtures thereof. In the context of the present invention, an inert carrier gas is one that is generally unreactive with the complexes described herein and does not interfere with the formation of a metal-containing film.

Alternatively, however, the precursor composition can be vaporized in the presence of a reaction gas to form a film. The reaction gas can be selected from a wide variety of gases reactive with the complexes described herein, at least at a surface under the conditions of chemical vapor deposition. Relatively pure metal or metal alloy films can also be produced using a reducing gas, such as hydrogen, optionally also using a plasma to enhance the deposition process. Examples of other reaction gases include oxygen, nitrogen oxides, ammonia, hydrazine, water vapor, ozone, hydrogen sulfide, hydrogen selenide, hydrogen telluride, silane, disilane, trichlorosilane, dichlorosilane, and the like. Various combinations of carrier gases and/or reaction gases can be used in the methods of the present invention to form metal-containing films. Thus, the metal-containing film can include a nitride, phosphide, arsenide, stibnide, oxide, sulfide, selenide, telluride, silicide, or combinations thereof. Such metal-containing films can be can also be formed by subjecting a relatively pure metal film to subsequent processing, such as annealing or rapid thermal oxidation, to form other metal-containing films, such as oxides or silicides, for example.

The complex containing chelating oxygen- and/or nitrogen-donor ligands is of the following formula:

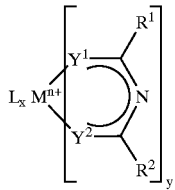

(Formula I)

wherein: M is a metal (main group, transition metal, or lanthanide); each Y group is independently O or N—$R^3$; L is a neutral or anionic supporting ligand (i.e., one that satisfies the valence state of the metal or completes the coordination sphere); each R group is independently H or an organic group (preferably, a ($C_1$–$C_8$) organic group); x=0 to 6 (preferably, 0 to 2); n+ is the oxidation state of the metal, which is typically 0 to +6; y=n if L is neutral, y=n−x if L is monoanionic, or y=n−2x if L is dianionic; and forming a metal-containing film from the precursor composition on a surface of the substrate (preferably, the semiconductor substrate or substrate assembly).

The complexes of Formula I can take the following forms (which are representative only):

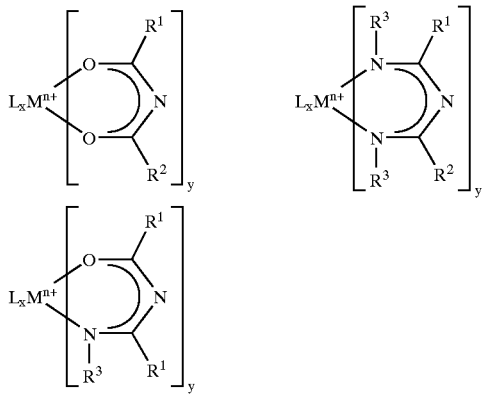

For certain methods of the present invention, preferably, M is selected from the group of metals of Groups IIA, IVB, VA, VB, VIIIB, and IB (i.e., Groups 2, 4, 5, 8–11, and 15). More preferably, M is selected from the group of Sr, Ba, Ti, Bi, Ta, Rh, Ir, Pd, Pt, Cu, and Ag. Even more preferably, M is Sr, Ba, Ti, or Cu. Most preferably, M is Sr, Ba, or Ti.

For complexes of Formula I wherein both Y groups are oxygen or $NR^3$ groups, M is a main group metal selected from the group of Groups IA, IIA, IVA, and VA (i.e., Groups 1, 2, 14, and 15) metals or a transition metal selected from the group of Groups IB, IIB, IIIB, IVB, VB, VIB, and VIIB (i.e., Groups 11, 12, and 3–7) metals. More preferably, M is selected from the group of Sr, Ba, Ti, Zr, Ta, Nb, Pb, and Bi. Most preferably, M is Sr, Ba, or Ti. For complexes of Formula I wherein one Y group is oxygen and the other is an $NR^3$ group, M is a main group metal, transition metal, or a lanthanide. More preferably, M is selected from the group of Sr, Ba, Ti, Zr, Ta, Nb, Pb, and Bi. Most preferably, M is Sr, Ba, or Ti.

Preferably, L is absent (x=0); however, if it is present, it is selected from the group of dialkyl- and trialkyl-amines, polyamines (e.g., N,N,N'N'N"-pentamethyldiethylenetriamine, diethylenetriamine), trialkylphosphines, ethers (including linear, branched, and cyclic ethers and polyethers), unsubstituted and fluoro-substituted alkyls (including linear, branched, and cyclic alkyls), unsubstituted alkenes (including linear, branched, and cyclic monoenes, dienes, and trienes, such as cyclopentadienyl and cyclooctadienyl), unsubstituted alkynes (including linear, branched, and cyclic alkynes), alkoxy groups (e.g., methoxy, ethoxy, isopropoxy), carboxylates, diketonates, thiolates, substituted silanes (including alkoxy substituted silanes, alkyl substituted silanes, alkenyl substituted silanes), as well as oxo, nitrile, and carbonyl ligands. Various combinations of such L groups can be present in a molecule. More preferably, L is carbonyl, cyclopentadienyl, cyclooctadienyl, ethoxy, isopropoxy, vinyltrimethylsilane, and polyamine.

A preferred class of complexes of Formula I include those in which M is Sr or Ba, x=0, y=2, $R^1$ and $R^2$ are each hydrogen or a sterically demanding alkyl group, such as a t-butyl group and, if present, $R^3$ is a sterically demanding alkyl group, such as a t-butyl group. This class of complexes of Formula I is particularly advantageous because the steric demands of the ligands ensure that the complexes will be mononuclear and sufficiently volatile for CVD.

As used herein, the term "organic group" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). In the context of the present invention, the organic groups are those that do not interfere with the formation of a metal-containing film. Preferably, they are of a type and size that do not interfere with the formation of a metal-containing film using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

Substitution is anticipated on the organic groups of the complexes of the present invention. As a means of simplifying the discussion and recitation of certain terminology used throughout this application, the terms "group" and "moiety" are used to differentiate between chemical species that allow for substitution or that may be substituted and those that do not allow or may not be so substituted. Thus, when the term "group" is used to describe a chemical substituent, the described chemical material includes the unsubstituted group and that group with O, N, Si, or S atoms, for example, in the chain (as in an alkoxy group) as well as carbonyl groups or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

Preferably, each R group ($R^1$, $R^2$, and $R^3$) in the complexes of Formula I is H or a ($C_1$–$C_8$) organic group. More preferably, each R group is H or a ($C_1$–$C_5$) organic group. Most preferably, each R group is a ($C_1$–$C_4$) alkyl moiety.

Various combinations of the complexes described herein can be used in a precursor composition. Thus, as used herein, a "precursor composition" refers to a liquid or solid that includes one or more complexes of the formulas described herein optionally mixed with one or more complexes or formulas other than those of Formula I. The precursor composition can also include one or more organic solvents suitable for use in a chemical vapor deposition system, as well as other additives, such as free ligands, that assist in the vaporization of the desired compounds. Preferred precursor compositions of the present invention include one or more organic solvents and two or more complexes of Formula I wherein M is selected from the groups of Ba, Sr, and Ti, or Bi, Sr, and Ta, or Bi, Sr, and Nb. Such precursor compositions include at least two complexes containing different metals (e.g., Ba and Ti). Preferably, such precursor compositions include at least three complexes containing different metals (e.g., Ba, Sr, and Ti).

The complexes described herein can be used in precursor compositions for chemical vapor deposition. Alternatively, certain complexes described herein can be used in other deposition techniques, such as sputtering, spin-on coating, and the like. Typically, those complexes containing R groups with a low number of carbon atoms (e.g., 1–4 carbon atoms per R group) are suitable for use with vapor deposition techniques. Those complexes containing R groups with a higher number of carbon atoms (e.g., 5–12 carbon atoms per R group) are generally suitable for spin-on or dip coating. Preferably, however, chemical vapor deposition techniques are desired because they are more suitable for deposition on semiconductor substrates or substrate assemblies, particularly in contact openings which are extremely small and require conformally filled layers of metal.

The complexes of the present invention can be prepared by a variety of methods known to one of skill in the art. For example, Ba($^t$Bu-C(O)—N—C(O)-$^t$Bu)$_2$ can be prepared from the reaction of BaI$_2$ with Li($^t$Bu-C(O)—N—C(O)-$^t$Bu).

As stated above, the use of the complexes and methods of forming films of the present invention are beneficial for a wide variety of thin film applications in semiconductor structures, particularly those using high dielectric materials or ferroelectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices. The complexes and methods of forming films of the present invention can also be used to prepare metallization layers, such as multilevel interconnects in an integrated circuit structure.

A specific example of where a film formed from the complexes of the present invention would be useful is the ferroelectric memory cell 10 of FIG. 1. The memory cell 10 includes a ferroelectric material 11, which is prepared by depositing one or more of the complexes discussed herein using chemical vapor techniques, between two electrodes 12 and 13, which are typically made of platinum, although other metals such as ruthenium, iridium, or gold can also be used. The bottom electrode 13 is typically in contact with a silicon-containing layer 14, such as an n-type or p-type silicon substrate, silicon dioxide, glass, etc. A conductive barrier layer 15 is positioned between the bottom electrode 13 and the silicon-containing layer 14 to act as a barrier to diffusion of atoms such as silicon into the electrode and ferroelectric material.

Figure 2:
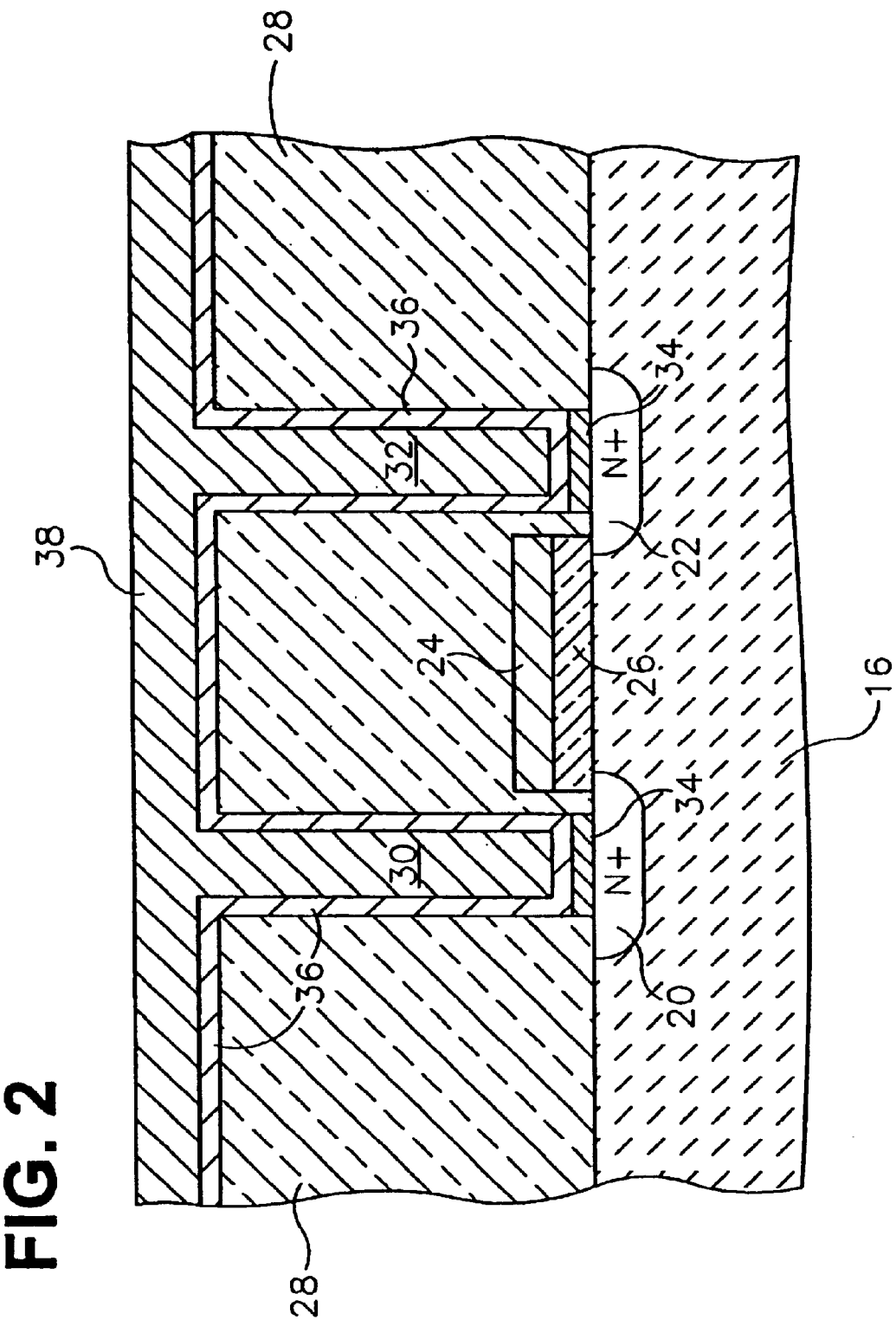
FIG. 2 is a cross-sectional schematic of a semiconductor contact or via having a metal-containing film deposited in accordance with the method of the present invention.

Another example of where a film formed from the complexes of the present invention would be useful is the structure shown in FIG. 2. The structure may be in the form of an n-channel MOSFET (n-channel metal-oxide semiconductor field-effect transistor), which may be used in a DRAM memory device. As shown, substrate 16 is a p-type silicon having two n-type silicon islands 20 and 22, representing the transistor source and drain. Such a construction is well known. The gate for the transistor is formed by a metal/polysilicon layer 24 deposited over a silicon dioxide layer 26. A relatively thick layer of an insulating silicon dioxide 28 overlies the active areas on substrate 16. A complex of Formula I may be used to vapor deposit one or more portions of layer 24.

To connect the MOSFET with electrically conductive paths (i.e., metal lines) on the surface of the device, contacts 30 and 32 have been etched through oxide layer 28 down to the surface of substrate 16. A metal or metal silicide layer 34, such as titanium silicide, is deposited and formed at the base of contact holes 30 and 32. A thin, conformal barrier layer 36 of a conductive material (e.g., titanium nitride, titanium aluminum nitride, titanium nitride silicide) is deposited over the walls of the contact holes 30 and 32. Because of the presence of the conductive barrier layer 36, the electrical contact path is excellent and metal 38 (e.g., Al or Cu), which is deposited over the barrier layer 36 is prevented from attacking the substrate surfaces. Complexes of Formula I may be used to vapor deposit layers 34, 36, or 38, for example.

Methods of the present invention can be used to deposit a metal-containing film, preferably a metal or metal alloy film, on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. The film is deposited upon decomposition (typically, thermal decomposition) of a complex of Formula I, preferably one that is either a volatile liquid, a sublimable solid, or a solid that is soluble in a suitable solvent that is not detrimental to the substrate, other layers thereon, etc. Preferably, however, solvents are not used; rather, the transition metal complexes are liquid and used neat. Methods of the present invention preferably utilize vapor deposition techniques, such as flash vaporization, bubbling, etc.

Figure 3:
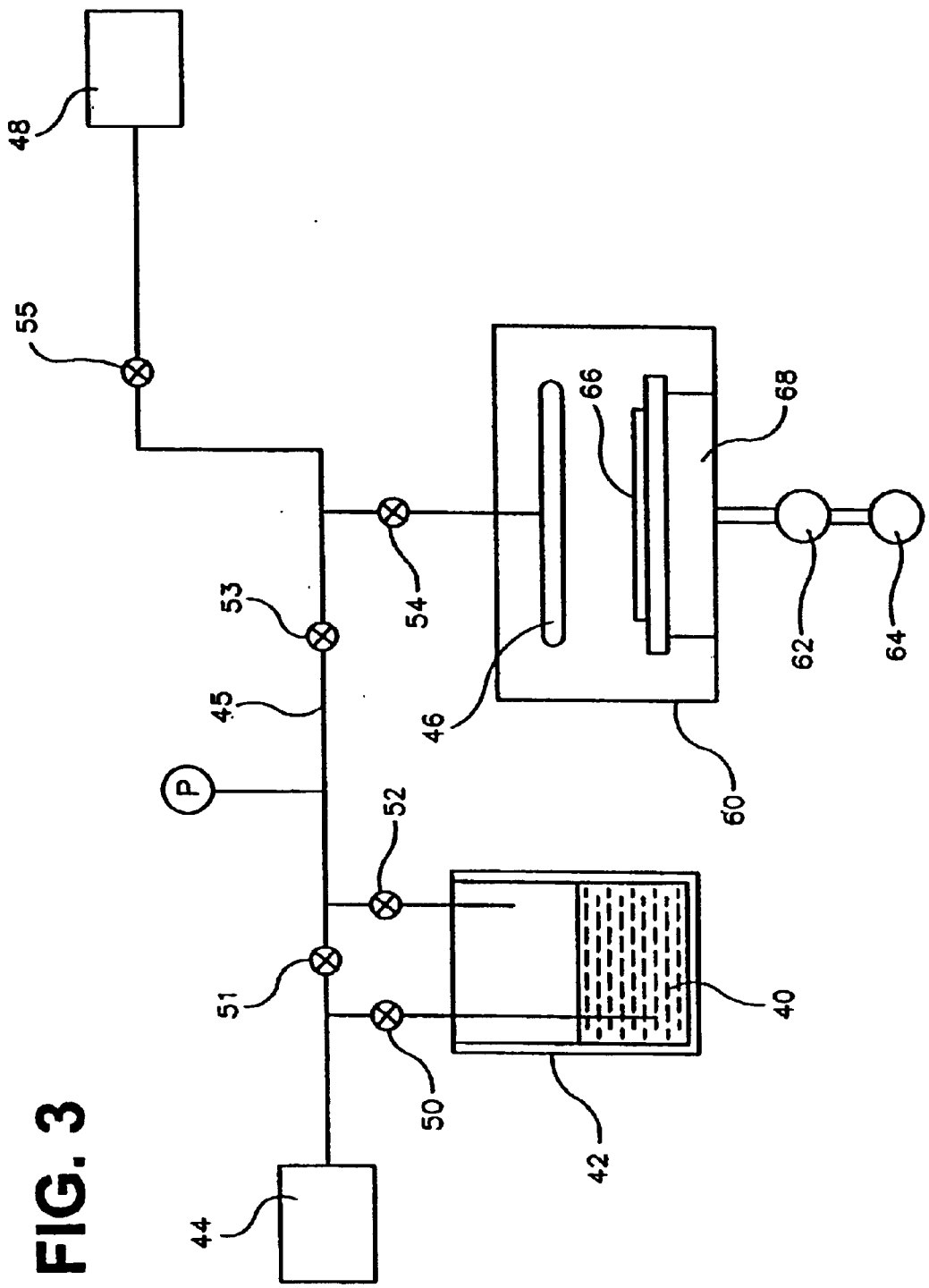
FIG. 3 is a perspective view of a chemical vapor deposition coating system suitable for use in the method of the present invention.

A typical chemical vapor deposition (CVD) system that can be used to perform the process of the present invention is shown in FIG. 3. The system includes an enclosed chemical vapor deposition chamber 60, which may be a cold wall-type CVD reactor. As is conventional, the CVD process may be carried out at pressures of from atmospheric pressure down to about $10^{-3}$ torr, and preferably from about 10 torr to about 0.1 torr. A vacuum may be created in chamber 60 using turbo pump 62 and backing pump 64.

One or more substrates 66 (e.g., semiconductor substrates or substrate assemblies) are positioned in chamber 60. A constant nominal temperature is established for the substrate, preferably at a temperature of about 100° C. to about 800° C., and more preferably at a temperature of about 50° C. to about 200° C. Substrate 66 may be heated, for example, by an electrical resistance heater 68 on which substrate 66 is mounted. Other known methods of heating the substrate may also be utilized.

In this process, the precursor composition 40, which contains one or more complexes of Formula I (and/or other metal or metalloid complexes), is stored in liquid form (a neat liquid at room temperature or at an elevated temperature if solid at room temperature) in vessel 42. A source 44 of a suitable inert gas is pumped into vessel 42 and bubbled through the neat liquid (i.e., without solvent) picking up the precursor composition and carrying it into chamber 60 through line 45 and gas distributor 46. Additional inert carrier gas or reaction gas may be supplied from source 48 as needed to provide the desired concentration of precursor composition and regulate the uniformity of the deposition across the surface of substrate 66. As shown, a series of valves 50–55 are opened and closed as required.

Generally, the precursor composition is pumped into the CVD chamber 60 at a flow rate of about 1 sccm (standard cubic centimeters) to about 1000 sccm. The semiconductor substrate is exposed to the precursor composition at a pressure of about 0.001 torr to about 100 torr for a time of about 0.01 minute to about 100 minutes. In chamber 60, the precursor composition will form an adsorbed layer on the surface of the substrate 66. As the deposition rate is temperature dependent, increasing the temperature of the substrate will increase the rate of deposition. Typical deposition rates are about 10 Angstroms/minute to about 1000 Angstroms/minute. The carrier gas containing the precursor composition is terminated by closing valve 53.

Figure 4:
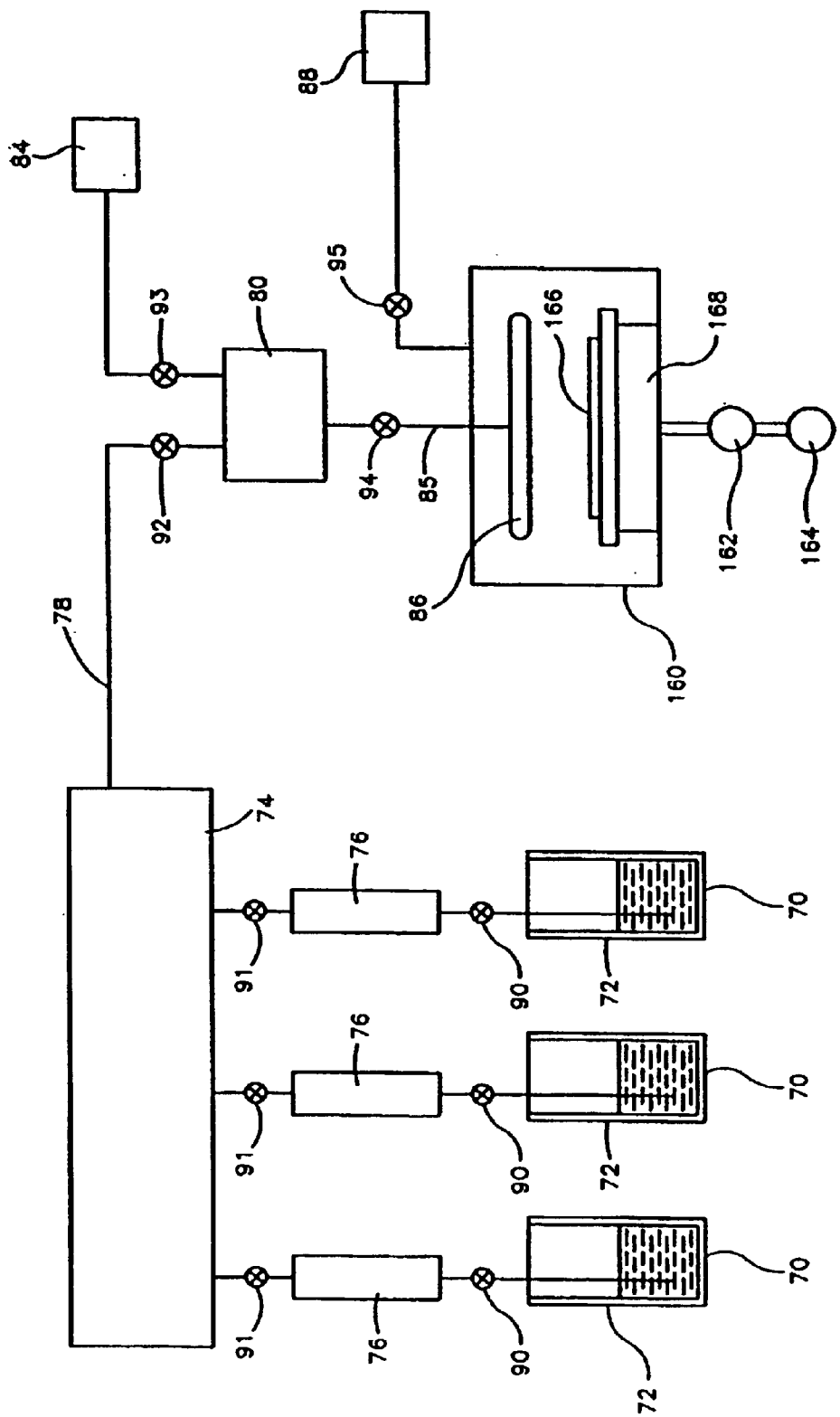
FIG. 4 is a perspective view of an alternative chemical vapor deposition coating system suitable for use in the method of the present invention.

An alternative CVD system that can be used to perform the process of the present invention is shown in FIG. 4. The system includes an enclosed chemical vapor deposition chamber 160, which may be a cold wall-type CVD reactor, in which a vacuum may be created using turbo pump 162 and backing pump 164. One or more substrates 166 (e.g., semiconductor substrates or substrate assemblies) are positioned in chamber 160. Substrate 166 may be heated as described with reference to FIG. 3 (for example, by an electrical resistance heater 168).

In this process, one or more solutions 70 of one or more precursor complexes of Formula I (and/or other metal or metalloid complexes), are stored in vessels 72. The solutions are transferred to a mixing manifold 74 using pumps 76. The resultant precursor composition containing one or more precursor complexes and one or more organic solvents is then transferred along line 78 to vaporizer 80, to volatilize the precursor composition. A source 84 of a suitable inert gas is pumped into vaporizer 80 for carrying volatilized precursor composition into chamber 160 through line 85 and gas distributor 86. Reaction gas may be supplied from source 88 as needed. As shown, a series of valves 90–95 are opened and closed as required. Similar pressures and temperatures to those described with reference to FIG. 3 can be used.

Alternatives to such methods include an approach wherein the precursor composition is heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society*, 78, 2763–2768 (1995). The complexes of Formula I are also particularly well suited for use with vapor deposition systems, as described in copending application U.S. Ser. No. 08/720,710 entitled "Method and Apparatus for Vaporizing Liquid Precursor compositions and System for Using Same," filed on Oct. 2, 1996. Generally, one method described therein involves the vaporization of a precursor composition in liquid form (neat or solution). In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compositions (either in the form of a neat liquid or solid dissolved in a liquid medium) and provides reasonable growth rates, particularly in device applications with small dimensions.

Various combinations of carrier gases and/or reaction gases can be used in certain methods of the present invention. They can be introduced into the chemical vapor deposition chamber in a variety of manners, such as directly into the vaporization chamber or in combination with the precursor composition.

Although specific vapor deposition processes are described by reference to FIGS. 3–4, methods of the present invention are not limited to being used with the specific vapor deposition systems shown. Various CVD process chambers or reaction chambers can be used, including hot wall or cold wall reactors, atmospheric or reduced pressure reactors, as well as plasma enhanced reactors. Furthermore, methods of the present invention are not limited to any specific vapor deposition techniques.

The following examples are offered to further illustrate the various specific and preferred embodiments and techniques. It should be understood, however, that many variations and modifications may be made while remaining within the scope of the present invention.

EXAMPLES

Example 1

Synthesis of Ba($^t$BuC(O)NC(O)$^t$Bu)$_2$

A Schlenk flask is charged with 10.0 g (26 mmol) of BaI$_2$, which is suspended in 100 mL of THF. To this is added 104 mL (26 mmol) of 0.5M THF solution of Li($^t$BuC(O)NC(O)$^t$Bu), which is prepared by reacting butyl lithium with $^t$BuC(O)NHC(O)$^t$Bu. The mixture of Li($^t$BuC(O)NC(O)$^t$Bu) and BaI$_2$ is stirred for 20 hours. The solvent is then removed in vacuo. The crude product is extracted from the lithium iodide with hexanes and filtered into another flask. The solvent is removed in vacuo yielding a colorless solid, which is further purified by sublimation.

Example 2

Synthesis of Sr($^t$BuC(O)NC(O)$^t$Bu)$_2$

This compound is prepared in an analogous manner to the procedure outlined in Example I using SrI$_2$ as the starting material.

Example 3

Synthesis of Ti(O$^i$Pr)$_2$($^t$BuC(O)NC(O)$^t$Bu)$_2$

A Schlenk flask is charged with 12.0 g (60 mmol) of Ti(O$^i$Pr)$_2$Cl$_2$, which is dissolved in 100 mL of THF. To this is added 240 mL (120 mmol) of 0.5M THF solution of Li($^t$BuC(O)NC(O)$^t$Bu). The mixture of Li($^t$BuC(O)NC(O)$^t$Bu) and Ti(O$^i$Pr)$_2$Cl$_2$ is stirred for 24 hours. The solvent is then removed in vacuo. The crude product is extracted from the lithium chloride with hexanes and filtered into another flask. The solvent is removed in vacuo yielding a colorless solid, which is further purified by sublimation.

Example 4

Chemical Vapor Deposition of (Ba, Sr)TiO$_3$

Solutions of each of the precursors noted in Examples 1–3 are prepared by dissolving the solid compounds in THF to make 0.2M solutions in the respective metal. To the Ba and Sr precursor solutions are also added 1 equivalent each of N,N,N',N''-pentamethyldiethylenetriamine to stabilize monomeric precursor species. The solutions are added to three separate reservoirs of a CVD system and the liquids are pumped to a vaporizer in approximately equal proportions. The vaporizer is heated to 190° C., allowing stable vapor transport of the precursor vapor into a chamber held at 1 Torr. The substrate (polysilicon on thermally grown silicon oxide on p-type silicon wafer) is heated to 675° C. Precursor vapor is carried into the chamber using He gas flow of 50 sccm. A flow of 100 sccm oxygen reaction gas is added to the chamber via another inlet. Thickness of the deposited film is dependent upon deposition time. The Ba:Sr:Ti ratio could be manipulated by the individual liquid delivery rates.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A method of manufacturing a semiconductor structure, the method comprising:

providing a semiconductor substrate or substrate assembly;

providing a precursor composition comprising one or more complexes of the formula:

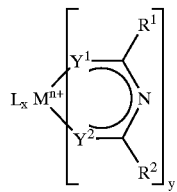

wherein:

M is a transition metal, main group metal, or lanthanide;

each Y group is independently O or N—$R^3$;

L is a neutral or anionic supporting ligand;

each R group is independently H, or an organic group;

x=0 to 6;

n+ is the oxidation state of the metal;

y=n if L is neutral, y=n−x if L is monoanionic, or y=n−2x if L is dianionic;

vaporizing the precursor composition to form vaporized precursor composition; and contacting the semiconductor substrate or substrate assembly with the vaporized precursor composition to form a metal-containing film on a surface of the semiconductor substrate or substrate assembly.

2. The method of claim 1 wherein contacting the semiconductor substrate or substrate assembly with the vaporized precursor composition comprises directing the precursor composition toward the semiconductor substrate or substrate assembly using a chemical vapor deposition technique.

3. The method of claim 2 wherein the chemical vapor deposition technique comprises flash vaporization, bubbling, microdroplet formation, or combinations thereof.

4. The method of claim 1 wherein the semiconductor substrate is a silicon wafer.

5. The method of claim 1 wherein M is selected from the group of metals of Groups IIA, IVB, VA, VB, VIIIB, and IB.

6. The method of claim 5 wherein M is selected from the group of Sr, Ba, Ti, Bi, Ta, Rh, Ir, Pd, Pt, Cu, and Ag.

7. The method of claim 6 wherein M is selected from the group of Sr, Ba, and Ti.

8. The method of claim 1 wherein each R group is independently H or a ($C_1$–$C_4$)alkyl moiety.

9. The method of claim 1 wherein each L is independently selected from the group of carbonyl, cyclopentadienyl, cyclooctadienyl, ethoxy, isopropoxy, vinyltrimethylsilane, and polyamine ligands.

10. The method of claim 1 wherein x=0, y=2, and M=Ba or Sr.

11. The method of claim 1 wherein the precursor composition is a liquid.

12. The method of claim 1 wherein the precursor composition is vaporized in the presence of a carrier gas.

13. The method of claim 1 wherein the precursor composition is vaporized in the presence of a reaction gas.

14. The method of claim 1 wherein the metal-containing film is a single metal or metal alloy film.

15. A method of manufacturing a semiconductor structure, the method comprising:

providing a semiconductor substrate or substrate assembly;

providing a precursor composition comprising one or more organic solvents and one or more complexes of the formula:

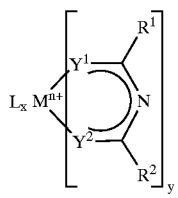

wherein:

M is a transition metal, main group metal, or lanthanide;

each Y group is independently O or N—$R^3$;

L is a neutral or anionic supporting ligand;

each R group is independently H, or an organic group;

x=0 to 6;

n+ is the oxidation state of the metal;

y=n if L is neutral, y=n−x if L is monoanionic, or y=n−2x if L is dianionic;

vaporizing the precursor composition to form vaporized precursor composition; and contacting the semiconductor substrate or substrate assembly with the vaporized precursor composition to form a metal-containing film on a surface of the semiconductor substrate or substrate assembly.

16. A method of forming a film on a substrate, the method comprising:

providing a substrate;

providing a precursor composition comprising one or more complexes of the formula:

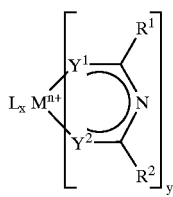

wherein:
M is a transition metal, main group metal, or lanthanide;
each Y group is independently O or N—$R^3$;
L is a neutral or anionic supporting ligand;
each R group is independently H, or an organic group;
x=0 to 6;
n+ is the oxidation state of the metal;
y=n if L is neutral, y=n−x if L is monoanionic, or y=n−2x if L is dianionic;

vaporizing the precursor composition to form vaporized precursor composition; and contacting the substrate with the vaporized precursor composition to form a metal-containing film on a surface of the substrate.

17. The method of claim 16 wherein contacting the substrate with the vaporized precursor composition comprises directing the precursor composition toward the substrate using a chemical vapor deposition technique.

18. The method of claim 17 wherein the precursor composition is a liquid.

19. A method of forming a film on a substrate, the method comprising:
providing a substrate;
providing a precursor composition comprising one or more solvents and one or more complexes of the formula:

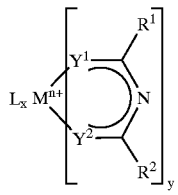

wherein:
M is a transition metal, a main group metal, or a lanthanide;
each Y group is independently O or N—$R^3$;
L is a neutral or anionic supporting ligand;
each R group is independently H, or an organic group;
x=0 to 6;
n+ is the oxidation state of the metal;
y=n if L is neutral, y=n−x if L is monoanionic, or y=n−2x if L is dianionic;

vaporizing the precursor composition to form vaporized precursor composition; and contacting the substrate with the vaporized precursor composition to form a metal-containing film on a surface of the substrate.

20. The method of claim 19 wherein contacting the substrate with the vaporized precursor composition comprises directing the precursor composition toward the substrate using a chemical vapor deposition technique.

* * * * *

UNITED STATES PATENT AND TRADEMARK OFFICE
CERTIFICATE OF CORRECTION

PATENT NO. : 6,828,256 B2
DATED : December 7, 2004
INVENTOR(S) : Brian A. Vaartstra It is certified that error appears in the above-identified patent and that said Letters Patent is hereby corrected as shown below:

Column 2,
Line 45, please delete "resent" and insert -- present --;

Column 4,
Line 23, please delete "suturated" and insert -- saturated --.

Signed and Sealed this

Nineteenth Day of July, 2005

JON W. DUDAS
*Director of the United States Patent and Trademark Office*